(12) United States Patent
Birkedal et al.

(10) Patent No.: US 7,883,914 B2
(45) Date of Patent: Feb. 8, 2011

(54) METHOD FOR FABRICATING A PHOTONIC CRYSTAL OR PHOTONIC BANDGAP VERTICAL-CAVITY SURFACE-EMITTING LASER

(75) Inventors: Dan Birkedal, Vaerløse (DK); Svend Bischoff, Fredensborg (DK); Michael Juhl, Frederiksberg (DK); Magnus Hald Madsen, Copenhagen (DK); Francis Pascal Romstad, Copenhagen (DK)

(73) Assignee: Alight Technologies A/S, Farum (DK)

( * ) Notice: Subject to any disclaimer, the term of this patent is extended or adjusted under 35 U.S.C. 154(b) by 150 days.

(21) Appl. No.: 12/302,554

(22) PCT Filed: May 27, 2007

(86) PCT No.: PCT/DK2007/050061

§ 371 (c)(1),
(2), (4) Date: Mar. 9, 2009

(87) PCT Pub. No.: WO2007/137588

PCT Pub. Date: Dec. 6, 2007

(65) Prior Publication Data

US 2009/0203158 A1 Aug. 13, 2009

(30) Foreign Application Priority Data

May 29, 2006 (DK) ................................ 2006 00728

(51) Int. Cl.
*H01L 21/00* (2006.01)
(52) U.S. Cl. ........................ 438/46; 257/81; 257/102; 372/7; 372/96
(58) Field of Classification Search .................. 438/46; 257/81, 102; 372/7, 96
See application file for complete search history.

(56) References Cited

U.S. PATENT DOCUMENTS

| | | | | |
|---|---|---|---|---|
| 6,320,893 B1* | 11/2001 | Ueki | ............................ | 372/96 |
| 6,507,595 B1* | 1/2003 | Kapon et al. | ............ | 372/45.013 |
| 6,534,331 B2* | 3/2003 | Liao et al. | ....................... | 438/46 |
| 6,570,905 B1* | 5/2003 | Ebeling | ........................ | 372/96 |
| 6,683,898 B2 | 1/2004 | Ostergaard et al. | | |
| 2002/0163947 A1 | 11/2002 | Ostergaard et al. | | |
| 2005/0265415 A1* | 12/2005 | Lambkin | .................. | 372/43.01 |
| 2007/0091965 A1* | 4/2007 | Tanabe et al. | ........... | 372/50.124 |

FOREIGN PATENT DOCUMENTS

| | | |
|---|---|---|
| WO | WO 02/073753 A2 | 9/2002 |
| WO | WO 2006/056208 A2 | 6/2006 |

OTHER PUBLICATIONS

O. Painter et al., "Two-Dimensional Photonic Band-Gap Defect Mode Laser", Science, vol. 284, Jun. 11, 1999, pp. 1819-1821.
W.D. Zhou et al., "Electrically injected single-defect photonic bandgap surface-emitting laser at room temperature", Electronics Letters, vol. 36, No. 18, Aug. 31, 2000, 2 pgs.

(Continued)

*Primary Examiner*—Jarrett J Stark
*Assistant Examiner*—Nicholas Tobergte
(74) *Attorney, Agent, or Firm*—Stephen A. Bent; Foley & Lardner LLP

(57) ABSTRACT

The invention relates to fabrication of VCSELs. It provides a method for fabricating a VCSEL that contains a micro/nano-structured mode selective lateral layer, where the micro/nano-structured layer is obtained by well controlled local etching. The invention enables control of the micro/nano-structured layer thickness with very high precision. In particular, the invention relates to a method for fabricating a VCSEL with a micro/nano-structured mode selective layer for controlling the VCSELs transverse electromagnetic modes.

14 Claims, 4 Drawing Sheets

OTHER PUBLICATIONS

F. Romstad et al., "True Photonic band-gap mode-control in VCSEL structures", ECOC'03, pp. 40-41 (2003).

D. Birkedal et al., "Photonic bandgap VCSELs", Conference on Lasers and Eelctro-Optics (CLEO) IEEE Piscataway, NJ, USA, vol. 1, 2004, 2 pgs.

Aaron J. Danner et al., "Single mode photonic crystal vertical cavity lasers", Applied Physics Letters, 88, (2006), pp. 091114-1-091114-3.

B. Bischoff et al., "Single-mode photonic bandgap VCSELs", ECOC'04 Proceedings, vol. 3, pp. 596-597, 2004.

* cited by examiner

METHOD FOR FABRICATING A PHOTONIC CRYSTAL OR PHOTONIC BANDGAP VERTICAL-CAVITY SURFACE-EMITTING LASER

FIELD OF THE INVENTION

The invention relates to fabrication of VCSELs. It relates to a method for fabricating a VCSEL that contains a micro/nano-structured mode selective lateral layer, where the micro/nano-structured layer is obtained by well controlled local etching. The invention enables control of the micro/nano-structured layer thickness with very high precision. In particular, the invention relates to a method for fabricating a VCSEL with a micro/nano-structured mode selective layer for controlling the VCSELs transverse electromagnetic modes.

BACKGROUND OF THE INVENTION

Vertical-cavity surface-emitting lasers (VCSELs) are of great interest because of their good performance and wide-ranging applicability. Low fabrication costs requires a high production yield, and it is therefore a requirement that the fabrication method used for their production is strictly controllable. A high yield is obtained only when each and every processing step of the fabrication method is under control.

Fabrication of VCSELs containing a lateral layer with an etched micro/nano-structured mode selective layer for controlling the electromagnetic modes in the VCSEL include extra fabrication steps. The process may involve steps such a resist deposition, resist exposure, resist development, etching or material deposition, and resist removal. Obtaining a high yield in fabrication of micro/nano-structured VCSELs requires fine control of all these steps.

The VCSEL performance depends critically on the etch depth when fabricating the micro/nano-structured mode selective element. The etch depth is typically determined by the etch rate so that the total etch time determines the etch depth. Unfortunately, the etch rate depends on many parameters; for wet chemistry etching e.g. temperature, chemicals, concentration; for dry chemistry etching e.g. gas-flow, gas-pressure, used gasses amount of reactive and non-reactive gasses, and gas mixture.

In "Electrically injected single-defect photonic bandgap surface-emitting laser at room temperature", Electronics Letters, vol. 36, no. 18 (31 Aug. 2000), authors W. D. Zhou et al. disclose a VCSEL structure comprising a bottom mirror, a top mirror, and a gain region sandwiched in between the two mirrors. Both mirrors are III-V semiconductor based. Deep holes are etched from the top of the top mirror, through the gain region, and into the bottom mirror. The holes are furthermore laid out in a regular array, with a defect in the center of the array. The etch depth is determined by estimating an etch rate and timing the etch. The problem of a well controlled etch depth is not addressed in the paper.

In U.S. Pat. No. 6,683,898, a VCSEL structure having a bottom mirror, a top mirror, and a gain region sandwiched in between the two is disclosed. A photonic crystal region is formed to prevent higher-order transverse modes in the VCSEL. The fabrication of the disclosed structures is complicated by re-growth steps and/or etch depths determined by timing the etch processes.

In "True photonic band-gap mode-control VCSEL structure", ECOC'03 pp. 40-41 (2003), authors F. Romstad et al. demonstrate how the wavelength can be well controlled by shallow etching (less than 100 nm) in a VCSEL. The shallow etching is done in a partial semiconductor top-mirror and the necessary top-mirror reflectivity needed to achieve lasing is obtained by depositing a dielectric top-mirror on top of the locally etched partial semiconductor top-mirror.

In "Single-mode photonic bandgap VCSELs", ECOC'04, Proceedings vol. 3, pp. 596-597 (2004), authors S. Bischoff et al. demonstrate a VCSEL relying on lateral mode confinement by the Photonic BandGap (PBG) effect. The PBG effect was implemented by shallow etching of rods in a partial semiconductor top-mirror. The top-mirror reflectivity needed to achieve lasing is obtained by depositing a dielectric top-mirror on top of the locally etched partial semiconductor top-mirror.

International application PCT/DK2005/000759 discloses a technique for lateral mode control in VCSELs, capable of providing large-aperture single-mode high-power VCSELs. The invention gives an improved VCSEL design by providing basic structural details allowing large-aperture single-mode high-power operation. A number of structures described therein are characterized in that they comprise a central light aperture region, which provides a long photon lifetime and overlaps with the active region. They also comprise a mode-shaping region formed so as to provide a photon lifetime shorter than that in the light aperture region. Furthermore, they comprise a mode confinement region designed to provide lateral confinement of modes to the mode-shaping region and the light aperture region. The dimensions of the regions are selected to engineer an efficiency of laser action in each transverse electromagnetic mode of a cavity in the VCSELs.

The above prior art descriptions of prior art VCSELs are all based on etching of a micro/nano-structured mode selective region in a complete or partial semiconductor top-mirror. A disadvantage of the methods is the need for a very well controlled etch process. The lack of high etch-depth control requires additional process characterization to determine the actual achieved etch depth.

Handling of a device during an etch process can be a significant source of process variation, especially when it comes to wet chemistry etch techniques. The time it takes to start and stop the etch process can contribute to the uncertainty, in particular if the etch rate is relatively high. This adversely affects production yield if not under control.

SUMMARY OF THE INVENTION

It is an objective of the present invention to provide an alternative method that provides better control of the micro/nano-structured layer thickness in VCSELs with a micro/nano-structured mode selective layer for lateral mode control. The improved layer thickness control is in a first aspect implemented by deposition of a thin layer of dielectric material or a partial dielectric top-mirror on top of a partial semiconductor top-mirror in which the micro/nano-structure is formed. The interface between semiconductor and dielectric material performs the function of an etch stop layer if only etch processes with a high ratio between the etch rate in dielectric material compared to the semiconductor material are used. The etch process can either be wet or dry chemistry.

Introducing such etch-stop layer provides the advantages that the etch depth becomes less dependent on etch rate and time, and that a measurement of the actual etch-depth achieved during processing is no longer necessary. Variations in the etch depth in fabrication methods according to the present invention are determined mainly by two factors: (1) the precision of the layer thickness with which the dielectric layer (partial dielectric top-mirror layers) can be deposited;

(2) the ratio of a first etch rate, that of the dielectric micro/nano-structured mode selective layer, to a second etch rate, that of the layer on which the dielectric micro/nano-structured mode selective layer is placed. The deposited dielectric material layer thickness across a 3 or 4 inch wafer can typically be controlled within a few percent (<2-4%). Thus, the etch depth variation has a maximum variation of 4 nm, when a 100 nm thick dielectric material layer has been deposited.

In the present description, the terms "above" and "below", and "top" and "bottom" in relation to the VCSEL structure, refer to relative positions in the structure when the VCSEL substrate is oriented horizontally with the emitting surface pointing upwards.

In a first aspect of the invention, a method of fabricating a VCSEL structure containing a micro/nano-structured mode selective region is provided. The method comprises the steps of:
   providing a substrate for holding the parts formed in the subsequent steps;
   forming a layer structure on the substrate, the layer structure comprising:
      a bottom mirror consisting of two or more layers;
      a III-V based gain region formed above the bottom mirror, the gain region being adapted to generate light and to emit the generated light;
      a top mirror comprising two or more layers formed above the gain region so that the bottom and top mirrors form a laser cavity holding the gain region;
      a micro/nano-structured mode selective region situated within the top mirror, the micro/nano-structured mode selective region comprising a light aperture, the dimensions of the micro/nano-structured mode selective region and the light aperture being adapted to at least partly control an efficiency of laser action in transverse electromagnetic modes of the cavity;
   the micro/nano-structured mode selective region being formed by:
      forming a dielectric micro/nano-structured mode selective layer placed where the micro/nano-structured mode selective region is to be situated;
      forming a masking layer on the dielectric micro/nano-structured mode selective layer, the masking layer comprising a masking pattern having a predetermined micro/nano-structured mode selective design/layout that corresponds to the micro/nano-structured mode selective region;
      etching, using an etch technique with the masking layer functioning as an etch mask, the predetermined micro/nano-structured mode selective design/layout into the dielectric micro/nano-structured mode selective layer to form the micro/nano-structured mode selective region;
      removing the masking layer;
   wherein layers of the top mirror above the dielectric micro/nano-structured mode selective layer are formed on the dielectric micro/nano-structured mode selective layer after the step of removing the masking layer;
   and wherein the etch technique has a first etch rate in the dielectric micro/nano-structured mode selective layer and a second etch rate in the layer on which the dielectric micro/nano-structured mode selective layer is formed, the first etch rate being higher than the second etch rate.

The term micro/nano is used to indicate that the structures are characterized primarily by features with sizes ranging from 10 nm up to 5 µm. Photonic bandgap-type structures, which are used to control the dispersion relation of light in composite materials, are an example of a micro/nano structure.

The difference between the first and the second etch rate means that the layer on which the dielectric micro/nano-structured mode selective layer is formed essentially acts as an etch-stop layer.

A separate oxidation layer can be incorporated into the cavity to allow for selective oxidation, for instance for the purpose of providing current confinement.

The ratio of the first etch rate to the second etch rate determines the efficiency of the etch-stop. According to the first aspect of the invention, the ratio is higher than 1. Preferably, the ratio between the first etch rate and the second etch rate is at least 1.2, such as at least 1.5, such as at least 2, such as at least 5, such as at least 10, such as at least 15, such than at least 20, such as at least 50, such as at least 100. A high ratio corresponds to a high etch stop efficiency.

If the dielectric is $SiO_2$ and the etch-stop layer is GaAs, the first etch rate will be around 40 nm/s and the second etch rate will be around 3 nm/s in case a $CHF_3$ reactive ion etch is used.

Preferably, the etching is stopped at a stopping point corresponding to the time at which the etching reaches the interface between the dielectric micro/nano-structured mode selective layer and the layer on which the dielectric micro/nano-structured mode selective layer is formed, or as soon as possible thereafter, preferably immediately thereafter, the stopping point being determined by an estimate of the etch depth based on an etching time and the first etch rate, or on another appropriate mechanism for estimating or determining said stopping point. This is an advantage since it minimises the etching into the underlying semiconductor (III-V) layer (etch-stop layer) which, albeit proceeding at the slower second etch rate, increases the variance of the etch depth.

Preferably, the etch technique used to form the lattice pattern in the dielectric layer is a $CHF_3$ dry etch or a $CF_4/O_2$ dry etch.

The dielectric micro/nano-structured mode selective layer may consist of for instance $SiO_x$, $TiO_x$, $TaO_x$, $CaF_2$, ZnSe, $MgF_2$, SiGe, Si, Ge, $Si_3N_4$, $Al_xO_y$ or a composition thereof. It may also consist of several sub-layers, rather than consisting of a single, homogeneous layer.

The dielectric layer is may e.g. be deposited using a PECVD process or a thermal sputtering process using or not using ion-assist.

If the top mirror of the VCSEL structure contains one or more dielectric layers, in addition to the dielectric micro/nano-structured mode selective layer, then these may e.g. be deposited using an ion-assisted e-beam glass sputtering process. Such layers might consist of for instance $SiO_x$, $TiO_x$, $TaO_x$, $CaF_2$, ZnSe, $MgF_2$, SiGe, Si, Ge, $Si_3N_4$, $Al_xO_y$ or a combination thereof.

To exemplify, a VCSEL structure fabricated according to the first aspect could be formed by:
   a forming bottom mirror layers on the substrate;
   a forming a gain region onto the bottom mirror;
   a forming first top mirror layer(s), e.g. a distributed Bragg reflector (DBR) stack, on the gain region;
   a forming a dielectric micro/nano-structured mode selective layer on the first top mirror layers;
   a forming remaining top mirror layer(s) on the dielectric micro/nano-structured mode selective layer.

The dielectric micro/nano-structured mode selective layer is thus an additional layer formed within the top mirror. The primary function of the dielectric micro/nano-structured mode selective layer is to enable precise control of the etch depth.

Preferably, the dielectric lattice layer is deposited using a deposition process characterized in that the relative uncertainty in the deposition thickness is less than 10%, such as less than 5%, such as less than 2%, such as less than 1%, such as less than 0.5%.

The variation is unavoidable, but very small at a given point on the wafer and significantly lower than etch depth variations that can result in III-V layers.

The second aspect the invention involves use of a lift-off process, where a masking layer is formed on top of a partial semiconductor top-mirror in which the inverse of the micro/nano-structure is formed. The dielectric micro/nano-structured layer is deposited partly on the semiconductor top-mirror, where the masking layer has been removed, and partly on the masking layer. The masking layer resist is now together with the dielectric material on top of it removed by a lift-off process, leaving the dielectric micro/nano-structured layer on top of the semiconductor top-mirror.

The lateral mode control by a micro/nano-structured mode selective element in a resonator like a VCSEL is determined by the cavity resonance wavelength difference between etched and un-etched regions. The cavity resonance wavelength shift as function of etch depth decreases with decreasing refractive index of the etched layer. The cavity resonance wavelength is accordingly less sensitive to variations in the etch depth when the local shallow etching is done in a low refractive index dielectric material compared to a layer of high refractive index semiconductor material.

The basic idea of the invention is that better reproducibility of VCSELs with a micro/nano-structured mode selective region can be obtained by introducing a layer combination that provides a handle for controlling the formation of an etched micro/nano-structured mode selective region. The inventors have further realized that a dielectric layer on a III-V layer can provide such a handle because etch techniques exist that proceed with different rates in the two layers. At the same time, VCSELs fabricated according to the present invention can provide high-power, single-mode operation, and the present method is therefore very desirable.

A second aspect of the invention provides a method of fabricating a vertical cavity surface-emitting laser (VCSEL) structure containing a micro/nano-structured mode selective region, the method comprising the steps of:

providing a substrate for holding the parts formed in the subsequent steps;

forming a layer structure on the substrate, the layer structure comprising:

a bottom mirror consisting of two or more layers;

a III-V based gain region formed above the bottom mirror, the gain region being adapted to generate light and to emit the generated light;

a top mirror comprising two or more layers formed above the gain region so that the bottom and top mirrors form a laser cavity holding the gain region;

a micro/nano-structured mode selective region situated within the top mirror, the micro/nano-structured mode selective region comprising a light aperture, the dimensions of the micro/nano-structured mode selective region and the light aperture being adapted to at least partly control an efficiency of laser action in transverse electromagnetic modes of the cavity;

the micro/nano-structured mode selective region being formed by:

forming a masking layer placed where the micro/nano-structured mode selective region is to be situated;

patterning the masking layer comprising a masking pattern having a predetermined inverse micro/nano-structure defining the micro/nano-structured mode selective region;

forming the dielectric micro/nano structured mode selective layer on the patterned masking layer, using the masking layer to lift-off dielectric material thus forming a micro/nano-structure in the dielectric mode selective layer, which is the inverse of the masking layer micro/nano-structured design/layout;

wherein layers of the top mirror above the dielectric micro/nano-structured mode selective layer are formed on the dielectric micro/nano-structured mode selective layer after forming the micro/nano-structured layer.

DETAILED DESCRIPTION OF THE INVENTION

Figure 1:
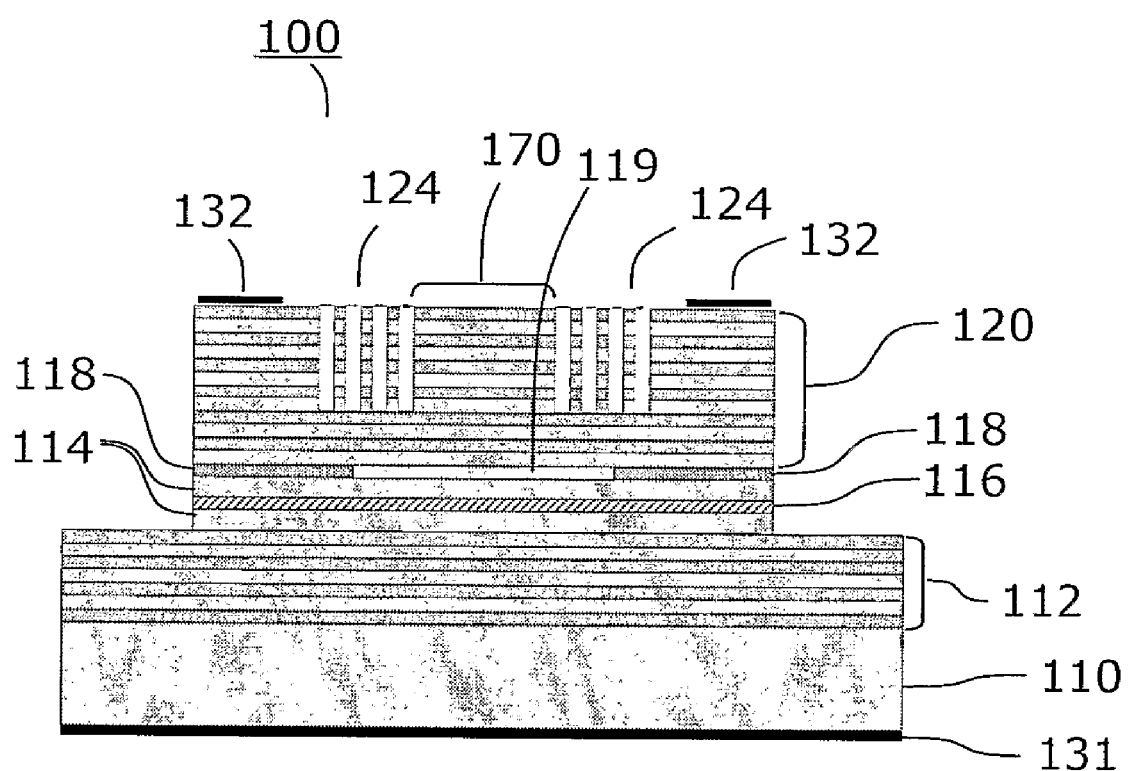
FIG. 1 illustrates a prior art VCSEL wherein the lateral components of the electromagnetic modes of the cavity are controlled mainly by an oxide layer and by an etched structure in the VCSELs top mirror.

An example of a prior art VCSEL structure 100 is shown in FIG. 1. It comprises a substrate 110, a bottom mirror 112, a gain region 116, spacer layers 114, an oxidation layer for current confinement/optical confinement 118/119, a semiconductor (III-V) top mirror 120, an n-contact 131 and a p-contact 132. This structure furthermore contains a vertical micro/nano-structuring 124 that is formed in a part of the top mirror by etching through several distributed Bragg reflector (DBR) mirror periods. The micro/nano structuring within the top-mirror is implemented with respect for lateral mode confinement to the defect section 170. The composition of the gain region 116 is typically chosen to provide gain in the wavelength region to be emitted by the VCSEL. Typically, they are formed of a combination of GaAs and AlGaAs. The present invention is not limited to these materials. For example GaNAs, InGaNAs, InGaNSbAs, InGaAs, GaInNAs, InGaAsP, and InGaP are often used to provide emission at wavelengths of 650, 780, 850, 980, 1300, 1550 and 2000 nm. The gain section typically consist of one or several quantum wells providing gain, which are separated by barrier layers.

The cavity resonance wavelength shift is very small for shallow etches in a complete VCSEL DBR top-mirror (Romstad et. al 2003). The cavity resonance wavelength shift depends on the number of remaining DBR quarter-wavelength layers in the top mirror 120 after etching. Therefore, the etch in a complete VCSEL DBR top-mirror requires etching through several DBR mirror pairs resulting in a relatively large cavity resonance wavelength shift of several nanometers. Unfortunately, the removal of DBR top-mirror pairs corresponds to an increasing top-mirror loss. The lateral mode control/confinement will be determined by a combination of the cavity resonance wavelength shift and optical losses from the deeply etched structure.

Fabricating the VCSEL structure in FIG. 1 involves etching the micro/nano-structure 124 into the top mirror 120, using for instance a dry chemistry etching technique. The depth of the micro/nano-structure must therefore be controlled via the etch time. Variations in for instance surface condition, temperature and handling, and chamber environment may result in a significant variation of the etch depth, which in turn will result in a reduced yield in the case where uniformity is a requirement. Control of the cavity resonance shift is limited with this fabrication method, and whether a laser ends up with the desired characteristics is thus in part left to chance.

Figure 2A:
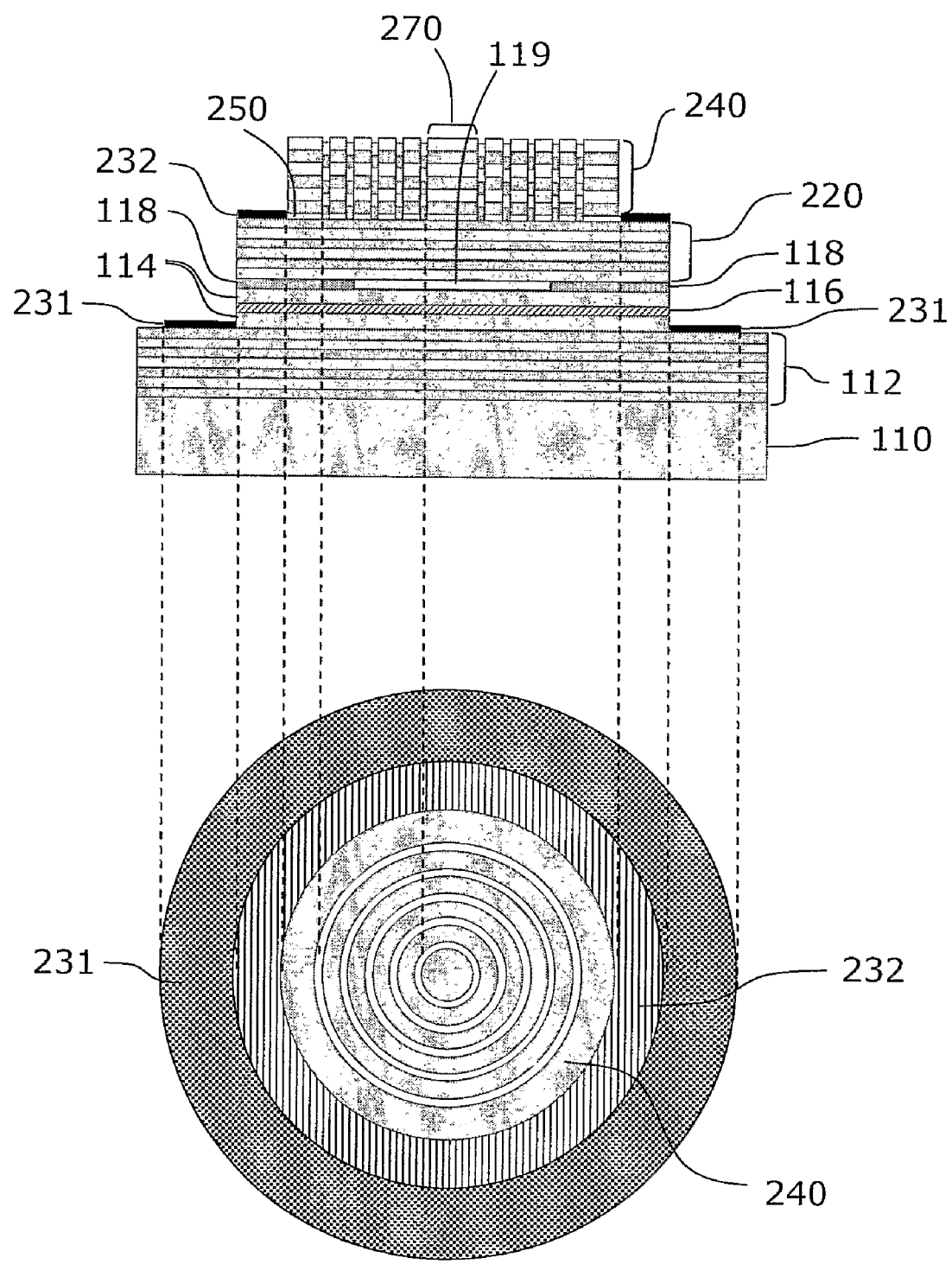
FIG. 2a illustrates a VCSEL fabricated according to the present invention. The lateral components of the electromagnetic modes of the cavity are controlled mainly by an embedded micro/nano-structured mode selective structure etched into a thin dielectric layer adjacent to a partial semiconductor top-mirror. A partial dielectric top-mirror (240) is deposited after the local shallow etching of the first deposited dielectric layer (250). The top-view shows an example of a one-dimensional lateral mode confinement structure (231,232,240).
Figure 2B:
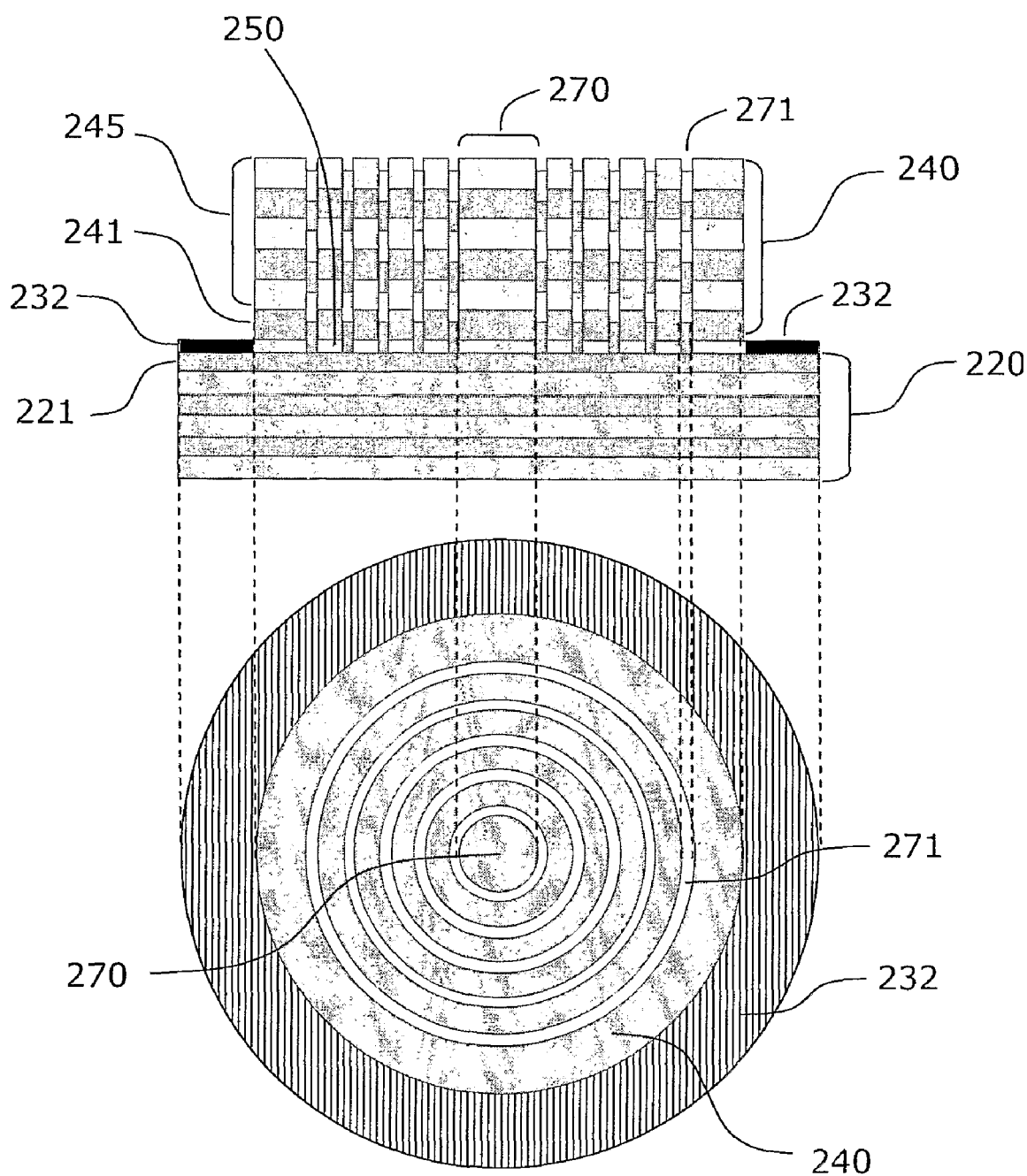
FIG. 2b illustrates the top part of the VCSEL from FIG. 2a. The figure shows the partial semiconductor and dielectric top-mirror. The top-view shows a one-dimensional lateral mode confinement structure (232,240,270,271).

The VCSEL structure 200 in FIG. 2a, which has a structure fabricated in accordance with the present invention, shares a number of elements with the structure in FIG. 1. In particular, it contains a substrate 110, a bottom mirror 112, a gain region 116, spacer layers 114 and an oxidation layer for current confinement 118/119. However, instead of a complete top mirror 120 (FIG. 1), it has a hybrid top mirror. The hybrid top-mirror consist of a partial semiconductor based top mirror 220, a thin layer of dielectric material 250 wherein the lateral mode selective and confining micro/nano-structure is defined by etching, and a partial dielectric top mirror 240. FIG. 2b illustrates a top-view of the micro/nano-structure of the dielectric top-mirror 240 in FIG. 2a, as well as the top- (232) and bottom-contact (231).

FIG. 2b also illustrates the top part of the VCSEL from FIG. 2a. The figure shows the partial semiconductor top-mirror 220, the top layer 221 of the partial top-mirror 220, the top-contact 232 and the dielectric layer 250 into which the micro/nano-structured lateral mode control element is etched. Layer 241 is the first layer of the top partial mirror 240. Layers 245 are any remaining layers of the top partial mirror, which in such case are deposited after layer 241. The remaining layers 245 may for instance be a stack of layers alternating between $TiO_x$ and $SiO_x$. In FIGS. 2a and 2b, a total of 7 layers are deposited on top of the III-V layer 221. FIG. 2b also illustrates a top-view of an example of a one-dimensional pattern of the micro/nano-structured layer/top-mirror. The dashed lines are included to illustrate the relationship between the VCSEL seen from the side and seen from the top. A defect 270 is formed in the center and acts as an aperture for the light generated in the cavity.

In FIG. 2a and FIG. 2b, the lattice region 250 has multiple layers both above and below it, i.e., section 220 and 240 consist of several layers. Section 220 may also consist of just a single layer, e.g. by making layer 220 a spacer layer instead of a partial top-mirror layer. Similarly, section 240 may consist of just a single layer, putting the lattice region 250 near the top of the top mirror. The only requirement is that the combination of section 220, layer 250 and section 240 provide sufficient reflectivity to achieve lasing.

The fabrication of the VCSEL structure illustrated in FIG. 2a could be done by the following. The bottom mirror 112 is formed by epitaxially growing the alternating layers onto the substrate 110. The lower, n-doped spacer layer 114, the gain section 116, the upper, p-doped spacer layer 114, and an oxidation layer 118/119 for current confinement are grown in the same epitaxial process on top of the lower bottom mirror 112. The first part of the top-mirror 220 is also grown in the same epitaxial process. The dielectric layer 250 is deposited on top of layer 221 (see FIG. 2b) by for example a plasma-enhanced chemical vapour deposition (PECVD) process. Layer 221 is the top layer of the partial semiconductor top-mirror 220. Processing of the wafer material involves mesa definition, selective oxidation for lateral current confinement, definition of n- and p-contacts as well as the definition and etching of the micro/nano-structured mode selective design. The micro/nano-structure can typically be defined by lithograpy or nano-imprint. The micro/nano-structure mode selective element can be etched into the dielectric layer 250 by for example using a $CHF_3$ reactive ion etch, $CF_4/O_2$ reactive ion etch or BHF wet etch. The $CHF_3$ etch selectively etches the dielectric because the etch rate in the underlying semiconductor (III-V) layer, layer 221 in FIG. 2b, is lower than in the dielectric layer 250. The semiconductor (III-V) layer 221 therefore functions as an etch-stop layer, improving control of the etch depth.

The deposition of the dielectric top-mirror can be performed as part of the other necessary VCSEL processes, after the completion of the etching of the micro/nano-structured mode selective layer 250.

Preferably, section 240 contains at least one dielectric layer, and preferably, all layers in section 240 are dielectric layers.

Figure 3:
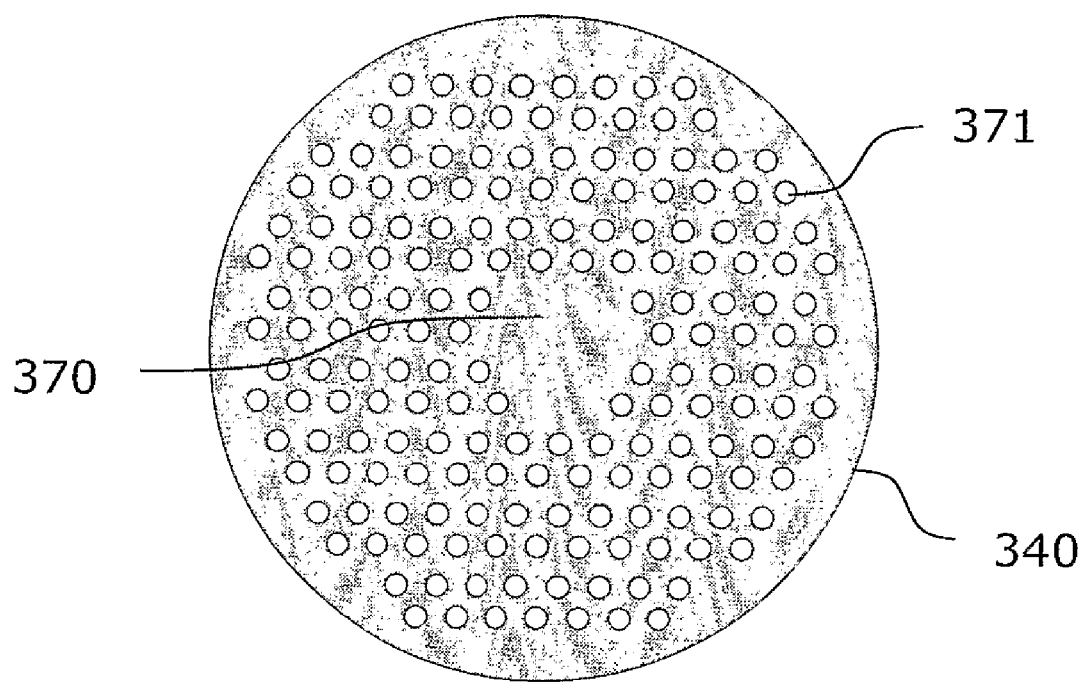
FIG. 3 illustrates an example of a two-dimensional lateral mode control element implemented by etching of holes in a regular lattice. The central part is typically un-etched, since light emission is designed to come from this area (PBG or PhC defect).

FIG. 3 illustrates another example of micro/nano-structure for mode selection, which can be fabricated using the method according to the invention. In this case, the pattern consists of circular, identical holes that are laid out in a triangular pattern. The perimeter (shape) of the micro/nano-structured mode selective region is nearly circular. A hole diameter between 150 nm and 750 nm is typical. A typical diameter of the defect 270 is 6-12 um. A typical diameter of section 240 is 20 um. A typical inner and outer diameter of the contact 232 is 20 um (equal to the diameter of section 240) and 60 um, respectively. A typical inner and outer diameter of the contact 131 is 60 um (equal to the out diameter of contact 232) and 70 um, respectively.

In the above description, certain specific details of disclosed embodiments such as specific materials, designs and dimensions etc, are set forth for purposes of explanation rather than limitation, so as to provide a clear and thorough understanding of the present invention. However, it should be understood readily by those skilled in this art, that the present invention may be practiced in other embodiments without departing from the spirit and scope of this disclosure. Further, in this context, and for the purposes of brevity and clarity, detailed descriptions of well-known processes and methodology have been omitted so as to avoid unnecessary detail and possible confusion.

The invention claimed is:

1. A method of fabricating a vertical cavity surface-emitting laser (VCSEL) structure containing a micro/nano-structured mode selective region, the method comprising the steps of:
   a. providing a substrate for holding the parts formed in the subsequent steps;
   b. forming a layer structure on the substrate, the layer structure comprising:
      (i) a bottom mirror consisting of two or more layers;
      (ii) a III-V based gain region formed above the bottom mirror, the gain region being adapted to generate light and to emit the generated light;
      (iii) a top mirror comprising two or more layers formed above the gain region so that the bottom and top mirrors form a laser cavity holding the gain region;

(iv) a micro/nano-structured mode selective region positioned within the top mirror, the micro/nano-structured mode selective region comprising a light aperture, the dimensions of the micro/nano-structured mode selective region and the light aperture being adapted to at least partly control an efficiency of laser action in transverse electromagnetic modes of the cavity;

wherein, the micro/nano-structured mode selective region being formed by:
  (i) forming a dielectric micro/nano-structured mode selective layer placed where the micro/nano-structured mode selective region is to be positioned;
  (ii) forming a masking layer on the dielectric micro/nano-structured mode selective layer, the masking layer comprising a masking pattern having a predetermined micro/nano-structured mode selective design/layout that corresponds to the micro/nano-structured mode selective region;
  (iii) etching, using an etch technique with the masking layer functioning as an etch mask, the predetermined micro/nano-structured mode selective design/layout into the dielectric micro/nano-structured mode selective layer to form the micro/nano-structured mode selective region;
  (iv) removing the masking layer;

wherein layers of the top mirror above the dielectric micro/nano-structured mode selective layer are formed on the dielectric micro/nano-structured mode selective layer after the step of removing the masking layer; and wherein the etch technique has a first etch rate in the dielectric micro/nano-structured mode selective layer and a second etch rate in the layer on which the dielectric micro/nano-structured mode selective layer is formed, the first etch rate being higher than the second etch rate.

2. A method according to claim 1, further comprising the step of stopping the etching at or immediately after a stopping point, the stopping point corresponding to a time at which the etching reaches the interface between the dielectric micro/nano-structured mode selective layer and the layer on which the dielectric micro/nano-structured mode selective layer is formed.

3. A method according to claim 1, wherein the ratio between the first etch rate and the second etch rate is at least 1.2, such as at least 1.5, such as at least 2, such as at least 5, such as at least 10, such as at least 15, such than at least 20, such as at least 50, such as at least 100.

4. A method according to claim 1, wherein the dielectric micro/nano-structured mode selective layer is deposited using a deposition process characterized in that the relative uncertainty in the deposition thickness is less than 10%, such as less than 5%, such as less than 2%, such as less than 1%, such as less than 0.5%.

5. A method according to claim 1, wherein the dielectric micro/nano-structured mode selective layer is deposited using a PECVD process or a sputtering process.

6. A method according to claim 1, wherein the dielectric micro/nano-structured mode selective layer and further dielectric layers, if any, formed as a part of the top mirror, are made of one or more of: $SiO_x$, $TiO_x$, $TaO_x$, $CaF_2$, $ZnSe$, $MgF_2$, SiGe, Si, Ge, $Si_3N_4$, $Al_xO_y$.

7. A method according to claim 1, wherein an uppermost part of the top mirror consists of layers made of one or more of: $SiO_x$, $TiO_x$, $TaO_x$, $CaF_2$, $ZnSe$, $MgF_2$, SiGe, Si, Ge, $Si_3N_4$, $Al_xO_y$.

8. A method according to claim 1, wherein the etch technique is one of: a $CHF_3$ dry etch, a $CF_4/O_2$ dry etch, and a BHF wet etch.

9. A method according to claim 1, wherein layers of the top mirror above the dielectric micro/nano-structured mode selective layer comprises a III-V layer.

10. A method according to claim 1, wherein layers of the top mirror above the dielectric micro/nano-structured mode selective layer consists only of one or more dielectric layers.

11. A method according to claim 1, wherein layers of the top mirror below the dielectric micro/nano-structured mode selective layer consists only of one or more III-V layers.

12. A method according to claim 1, wherein the dielectric layer is formed on a III-V-layer.

13. A method according to claim 1, wherein the dielectric layer is formed directly on the III-V based gain region.

14. A method of fabricating a vertical cavity surface-emitting laser (VCSEL) structure containing a micro/nano-structured mode selective region, the method comprising the steps of:
  a. providing a substrate for holding the parts formed in the subsequent steps;
  b. forming a layer structure on the substrate, the layer structure comprising:
    (i) a bottom mirror consisting of two or more layers;
    (ii) a III-V based gain region formed above the bottom mirror, the gain region being adapted to generate light and to emit the generated light;
    (iii) a top mirror comprising two or more layers formed above the gain region so that the bottom and top mirrors form a laser cavity holding the gain region;
    (iv) a micro/nano-structured mode selective region positioned within the top mirror, the micro/nano-structured mode selective region comprising a light aperture, the dimensions of the micro/nano-structured mode selective region and the light aperture being adapted to at least partly control an efficiency of laser action in transverse electromagnetic modes of the cavity;
  wherein, the micro/nano-structured mode selective region being formed by:
    (i) forming a masking layer placed where the micro/nano-structured mode selective region is to be positioned;
    (ii) patterning the masking layer comprising a masking pattern having a predetermined inverse micro/nano-structure defining the micro/nano-structured mode selective region;
    (iii) forming the dielectric micro/nano structured mode selective layer on the patterned masking layer, using the masking layer to lift-off dielectric material thus forming a micro/nano-structure in the dielectric mode selective layer, which is the inverse of the masking layer micro/nano-structured design/layout;
  wherein layers of the top mirror above the dielectric micro/nano-structured mode selective layer are formed on the dielectric micro/nano-structured mode selective layer after forming the micro/nano-structured layer.

* * * * *